United States Patent
Zhang et al.

(10) Patent No.: US 8,012,316 B2
(45) Date of Patent: *Sep. 6, 2011

(54) FCC-LIKE TRILAYER AP2 STRUCTURE FOR CPP GMR EM IMPROVEMENT

(75) Inventors: Kunliang Zhang, Milpitas, CA (US); Dan Abels, San Francisco, CA (US); Min Li, Dublin, CA (US); Chyu-Jiuh Torng, Pleasanton, CA (US); Chen-Jung Chien, Sunnyvale, CA (US); Yu-Hsia Chen, Mountain View, CA (US)

(73) Assignee: Headway Technologies, Inc., Milpitas, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 12/583,742

(22) Filed: Aug. 25, 2009

(65) Prior Publication Data

US 2009/0314632 A1  Dec. 24, 2009

Related U.S. Application Data

(63) Continuation of application No. 11/234,719, filed on Sep. 23, 2005, now Pat. No. 7,583,481.

(51) Int. Cl.
*C23C 14/14* (2006.01)
(52) U.S. Cl. ......... 204/192.25; 204/192.12; 204/192.2; 204/192.15; 360/324.12; 360/324.11
(58) Field of Classification Search ............. 204/192.15, 204/192.12, 192.25, 192.2; 360/324.12, 360/324.11, 324.15
See application file for complete search history.

(56) References Cited

U.S. PATENT DOCUMENTS

| | | | |
|---|---|---|---|
| 5,627,704 A | 5/1997 | Lederman et al. | |
| 5,668,688 A | 9/1997 | Dykes et al. | |
| 5,715,121 A | 2/1998 | Sakakima et al. | |
| 6,208,492 B1 | 3/2001 | Pinarbasi | |
| 6,278,589 B1* | 8/2001 | Gill | 360/314 |
| 6,581,272 B1* | 6/2003 | Li et al. | 29/603.14 |
| 6,818,331 B2 | 11/2004 | Sakawaki et al. | |
| 6,903,904 B2 | 6/2005 | Li et al. | |
| 7,256,971 B2 | 8/2007 | Horng et al. | |
| 7,331,100 B2 | 2/2008 | Li et al. | |
| 7,583,481 B2* | 9/2009 | Zhang et al. | 360/324.11 |
| 2004/0075957 A1* | 4/2004 | Li et al. | 360/324.11 |
| 2005/0018366 A1* | 1/2005 | Sbiaa et al. | 360/324.11 |
| 2007/0014054 A1* | 1/2007 | Zhang et al. | 360/324.12 |

* cited by examiner

*Primary Examiner* — Keith Hendricks
*Assistant Examiner* — Jason Berman
(74) *Attorney, Agent, or Firm* — Saile Ackerman LLC; Stephen B. Ackerman

(57) ABSTRACT

A method of forming a CPP-GMR spin valve having a pinned layer with an AP2/coupling/AP1 configuration is disclosed wherein the AP2 portion is a FCC-like trilayer having a composition represented by $Co_zFe_{(100-z)}/Fe_{(100-x)}Ta_x/Co_zFe_{(100-z)}$ or $Co_zFe_{(100-z)}/Fe_yCo_{(100-y)}/Co_zFe_{(100-z)}$ where x is 3 to 30 atomic %, y is 40 to 100 atomic %, and z is 75 to 100 atomic %. Preferably, z is 90 to provide a face centered cubic structure that minimizes electromigration. Optionally, the middle layer is comprised of an Fe rich alloy such as FeCr, FeV, FeW, FeZr, FeNb, FeHf, or FeMo. EM performance is improved significantly compared to a spin valve with a conventional AP2 $Co_{50}Fe_{50}$ or $Co_{75}Fe_{25}$ single layer. MR ratio is also increased and RA is maintained at an acceptable level. The coupling layer is preferably Ru and the AP1 layer may be comprised of a lamination of CoFe and Cu layers as in [CoFe/Cu]$_2$/CoFe.

9 Claims, 2 Drawing Sheets

US 8,012,316 B2

FCC-LIKE TRILAYER AP2 STRUCTURE FOR CPP GMR EM IMPROVEMENT

This is a Continuation application of U.S. patent application Ser. No. 11/234,719, filed on Sep. 23, 2005, now U.S. Pat. No. 7,583,481 which is herein incorporated by reference in its entirety, and assigned to a common assignee

RELATED PATENT APPLICATION

This application is related to the following: Ser. No. 11/180,808, filing date Jul. 13, 2005; Ser. No. 10/796,387, filing date Mar. 9, 2004; and Ser. No. 10/886,288, filing date Jul. 7, 2004; all assigned to a common assignee.

FIELD OF THE INVENTION

The invention relates to an improved pinned layer for use in a giant magnetoresistive (GMR) sensor in a current perpendicular to plane (CPP) magnetic read head and in particular to a face centered cubic (FCC) AP2 composite film comprised of three layers that improves the electromigration (EM) performance and magnetoresistive (MR) ratio.

BACKGROUND OF THE INVENTION

A magnetic disk drive includes circular data tracks on a rotating magnetic disk and read and write heads that may form a merged head attached to a slider on a positioning arm. During a read or write operation, the merged head is suspended over the magnetic disk on an air bearing surface (ABS). The sensor in a read head is a critical component since it is used to detect magnetic field signals by a resistance change. The resistance change is produced by a giant magnetoresistance (GMR) effect which is based on a configuration in which two ferromagnetic layers are separated by a non-magnetic conductive layer in the sensor stack. One of the ferromagnetic layers is a pinned layer in which the magnetization direction is fixed by exchange coupling with an adjacent anti-ferromagnetic (AFM) or pinning layer. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, there is a current-in-plane (CIP) configuration where the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the magnetoresistive (MR) ratio is higher than for a CIP configuration.

In the CPP GMR head structure, a bottom spin valve film stack is generally employed for biasing reasons as opposed to a top spin valve where the free layer is below a copper spacer and the pinned layer is above the copper spacer. Additionally, a CoFe/NiFe composite free layer is conventionally used following the tradition of CIP GMR improvements. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity. Unfortunately, the MR ratio is often very low (<5%) in many CPP-GMR spin valve structures. An MR ratio of about 10% is required for advanced applications.

A synthetic anti-parallel (SyAP) pinned layer configuration represented by AP2/coupling/AP1 is preferred over a single pinned layer because a smaller net magnetic moment is possible for a SyAP layer and that means greater exchange coupling between the AFM layer and adjacent AP2 layer. It is also known in the art that a laminated AP1 layer made of alternating CoFe and thin Cu layers can improve the MR ratio in CPP-GMR heads. The resulting CPP-GMR bottom spin valve is represented by a seed/AFM/pinned/spacer/free/cap configuration where seed is a seed layer, the spacer is a copper layer, the free layer is a CoFe/NiFe composite, and the pinned layer has an [AP2/coupling/AP1] SyAP configuration in which Ru is the coupling layer, the AP2 layer is made of CoFe, and the AP1 layer is a [CoFe/Cu]$_n$CoFe laminated layer.

Another important consideration for CPP-GMR read heads is electromigration (EM) performance. For CPP spin valve structures having an AP2/coupling/AP1 pinned layer configuration, Fe rich CoFe alloys such as Fe$_{50}$Co$_{50}$ or Fe$_{70}$Co$_{30}$ in the AP1 layer are known to be effective in enhancing the MR ratio. However, Fe rich CoFe alloys usually result in poor EM performance. Therefore, it is very desirable to improve the EM performance of a CPP-GMR head having a Fe rich AP1 layer.

U.S. Pat. No. 5,715,121 discloses a further means of CPP-GMR improvement by inserting a confining current path (CCP) layer in the copper spacer by segregating metal path and oxide formation. The distribution of a Cu conductor in an electrical insulator (oxide) may vary as long as electrical conduction in the direction of film normal is larger than that in the direction of the film plane.

A bilayer seed structure having a non-magnetic metal seed layer with a FCC structure adjacent to a pinning layer in a spin valve sensor is described in U.S. Pat. No. 6,208,492. The bilayer seed structure increases the MR ratio but the effect on EM performance is not mentioned.

In U.S. Pat. No. 6,903,904, an AP2 layer is modified to form a multilayer structure by the insertion of at least one electron spin depolarizing layer such as Ta, Ti, Zr, or NiFeCr with an unspecified Fe content that minimizes the negative contribution from the AP2 layer to the GMR effect and thereby increases the MR ratio.

U.S. Pat. No. 6,818,331 discloses a FeTa layer as a soft magnetic undercoat that is formed on a substrate and below an orientation regulating layer. The FeTa layer increases the magnetic flux component from a magnetic head in a direction perpendicular to the substrate and improves the magnetic characteristics of the device.

SUMMARY OF THE INVENTION

One objective of the present invention is to provide a CPP-GMR spin valve having a SyAP pinned layer represented by a [AP2/coupling/AP1] configuration wherein the AP2 layer is a FCC like trilayer that results in improved EM performance for read head applications.

A further objective of the present invention is to provide an AP2 trilayer in a CPP-GMR spin valve according to the first objective that maintains or increases the MR ratio of the sensor element in the read head.

These objectives are achieved in one embodiment in which a sensor comprised of a bottom CPP-GMR spin valve configuration is formed in a magnetic read head. The sensor element may be formed on a substrate that is a bottom magnetic shield (S1), for example, and is comprised of a seed layer, AFM layer, pinned layer, spacer, free layer, and cap layer which are sequentially formed on the substrate. A key feature is that the pinned layer has a SyAP (AP2/coupling/AP1) configuration in which the AP2 layer is a FCC like trilayer with a composition represented by $Co_ZFe_{(100-Z)}/Fe_{(100-X)}Ta_X/Co_ZFe_{(100-Z)}$ or $Co_ZFe_{(100-Z)}/Fe_YCo_{(100-Y)}/Co_ZFe_{(100-Z)}$ where x is 3 to 30 atomic %, y is 40 to 100 atomic %, and z is 75 to 100 atomic %. Optionally, the FeTa middle layer in the AP2 composite film may be replaced by a Fe rich alloy such as FeCr, FeV, FeW, FeZr, FeNb, FeHf, FeMo, or the like. The coupling layer is one of Ru, Rh, or Ir and the AP1 layer is preferably a laminated film comprised of CoFe and Cu layers with a $[CoFe/Cu]_n/CoFe$ configuration where n is 2 or 3. A spacer on the AP1 layer may be comprised of an upper Cu layer, a lower Cu layer, and a middle CCP layer made of oxidized AlCu. Preferably, the free layer is a composite layer comprised of a higher Fe content ($v \geq 20$ atomic %) $Fe_VCo_{(100-V)}$ layer where v is from 20 to 70 atomic % and a Ni rich ($w \geq 85$ atomic %) $Ni_WFe_{(100-W)}$ layer that contacts the cap layer.

A spin valve stack that includes the aforementioned layers may be sputter deposited using Ar gas in a sputtering system that is equipped with an ultra-high vacuum. Oxide formation and segregated metal path definition in the AlCu CCP layer are achieved by following RF-PIT and RF-IAO processes that may be performed in a separate chamber in the sputter system. After the cap layer is deposited, the CPP-GMR stack is annealed and then patterned by a conventional method to form a CPP-GMR sensor having a top surface with sidewalls. A well known fabrication sequence to complete the read head is then followed that includes forming an insulating layer adjacent to both sidewalls and forming a second magnetic shield (S2) on the cap layer.

DETAILED DESCRIPTION OF THE INVENTION

The present invention is a CPP-GMR spin valve structure for use as a sensor in a read head of a magnetic recording device. The read head may be part of a merged read/write head. The spin valve structure is especially suited for an ultra-high magnetic recording device wherein the recording density is greater than about 100 Gbits/in². The drawings are provided by way of example and are not intended to limit the scope of the invention. Although a bottom spin valve structure is shown in the exemplary embodiment, those skilled in the art will appreciate that the novel FCC-like AP2 trilayer of the present invention may also be incorporated in a SyAP pinned layer of a top spin valve or in multilayer spin valves. Moreover, the invention encompasses TMR sensors or other magnetic devices that are based on a magnetoresistance effect and include a SyAP pinned layer.

Figure 1:
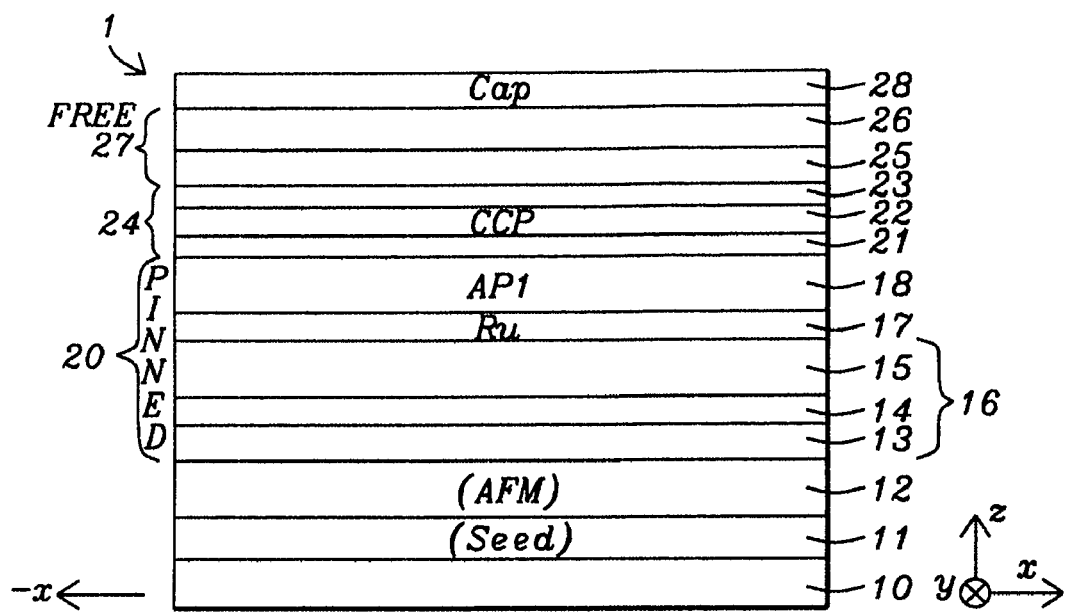
FIG. 1 is a cross-sectional view showing a CPP-GMR spin valve structure according to one embodiment of the present invention.

A first embodiment is depicted in FIG. 1 in which a CPP-GMR sensor comprised of a bottom spin valve structure is illustrated. The view in FIG. 1 is from a cross-section along an ABS (air bearing surface) plane in a read head. The inventors have unexpectedly found that the FCC-like AP2 trilayer described herein provides a significant increase in EM performance while maintaining or enhancing the MR ratio.

A substrate 10 is shown that is typically a first magnetic shield (S1) in a read head. For example, the substrate 10 may be comprised of a 2 micron thick layer of an electroplated permalloy (NiFe). It should be understood that the first magnetic shield may be disposed on a substructure (not shown) such as AlTiC. There is a seed layer 11 that may be comprised of a lower Ta layer (not shown) having a thickness from 10 to 60 Angstroms and preferably about 50 Angstroms thick, and an upper Ru layer having a thickness about 5 to 40 Angstroms thick and preferably 20 Angstroms thick formed on the substrate 10. The seed layer 11 promotes a smooth and uniform crystal structure in the overlying layers that enhances the MR ratio in the spin valve structure 1.

An AFM layer 12 is formed on the seed layer 11 and is preferably comprised of IrMn having a composition of about 18 to 22 atomic % Ir and a thickness of about 50 to 75 Angstroms. Alternatively, the AFM layer 12 may be made of MnPt having a composition between about 55 to 65 atomic % manganese and with a thickness of about 125 to 175 Angstroms. Those skilled in the art will appreciate that other materials such as NiMn, OsMn, RuMn, RhMn, PdMn, RuRhMn, or PtPdMn may also be employed as the AFM layer 12 which is used to pin the magnetization direction in an overlying ferromagnetic (pinned) layer 20.

In one embodiment, a synthetic anti-parallel (SyAP) pinned layer 20 is formed on the AFM layer 12 and is preferably comprised of an AP2/Ru/AP1 configuration wherein the Ru layer is a coupling layer 17. A key feature is that the AP2 layer is a FCC like trilayer hereafter referred to as AP2 trilayer 16 with a composition represented by $Co_ZFe_{(100-Z)}/Fe_{(100-X)}Ta_X/Co_ZFe_{(100-Z)}$ or $Co_ZFe_{(100-Z)}/Fe_YCo_{(100-Y)}/Co_ZFe_{(100-Z)}$ where x is 3 to 30 atomic %, y is 40 to 100 atomic %, and z is 75 to 100 atomic %. Optionally, the FeTa (or FeCo) middle layer 14 in the AP2 trilayer 16 may be replaced by an Fe rich alloy such as FeCr, FeV, FeW, FeZr, FeNb, FeHf, FeMo, or the like. An Fe rich alloy is defined as an alloy having an Fe content of about 70 atomic % or greater. In the $Co_ZFe_{(100-Z)}$ upper and lower layers 13, 15, z is preferably 90 since it is well known that $Co_{90}Fe_{10}$ easily forms a FCC structure. We have found that when a $Co_{90}Fe_{10}$ layer is grown on a seed/AFM stack comprised of Ta/Ru/IrMn that its [111] planes are exposed to the interfaces with the AFM layer 12 and coupling layer 17. Since the [111] planes are the closest packed planes for FCC structures, [111] planes should result in lower electron migration (EM) than other types of planes.

The terminology "FCC-like triple layer" used in the present invention means that the major component of the AP2 layer is an FCC material, preferably $Co_{90}Fe_{10}$, which is employed as the lower layer 13 and upper layer 15 in the AP2 trilayer 16 with an iron rich alloy inserted as a middle layer 14. Note that the middle layer 14 may not be a face centered cubic material. The lower layer 13 with a thickness from about 6 to 15 Angstroms is preferably thinner than the upper layer 15 which is 10 to 50 Angstroms thick. In conventional AP2/coupling/AP1 configurations, the AP2 layer is thinner than the AP1 layer. In this case, AP2 trilayer 16 thickness is greater than the AP1 layer 18 thickness to provide an asymmetry mean adjustment for the transfer curve of the real device. Furthermore, the lower layer 13 is thinner than the upper layer 15 to enhance the exchange coupling strength with the AFM layer 12. The Fe rich middle layer 14 in the AP2 trilayer 16 is 5 to 15 Angstrom thick and also serves to enhance the exchange coupling strength of the FCC-like triple layer 16 with the AFM layer 12. It is believed that the AP2 trilayer 16 has an advantage over prior art AP2 single layers made of $Co_{75}Fe_{25}$ or $Co_{50}Fe_{50}$ because the AP2 trilayer 16 has a similar exchange coupling strength as a single $Co_{75}Fe_{25}$ or $CO_{50}Fe_{50}$ AP2 layer but its FCC-like structure provides a substantial EM improvement.

The magnetic moment of the AP2 trilayer 16 is pinned in a direction anti-parallel to the magnetic moment of the AP1 layer 18. For example, the AP2 trilayer may have a magnetic moment oriented along the "+x" direction while the AP1 layer has a magnetic moment in the "−x" direction. Note that all of the layers 13, 14, 15 in the AP2 trilayer 16 have a magnetic moment in the same direction. The AP2 trilayer 16 has a different thickness than the AP1 layer 18 to produce a small net magnetic moment for the pinned layer 20. Exchange coupling between the AP2 trilayer 16 and the AP1 layer 18 is facilitated by a coupling layer 17 that is preferably comprised of Ru with a thickness of about 7.5 Angstroms. Optionally, Rh or Ir may be employed as the coupling layer 17.

Figure 3:
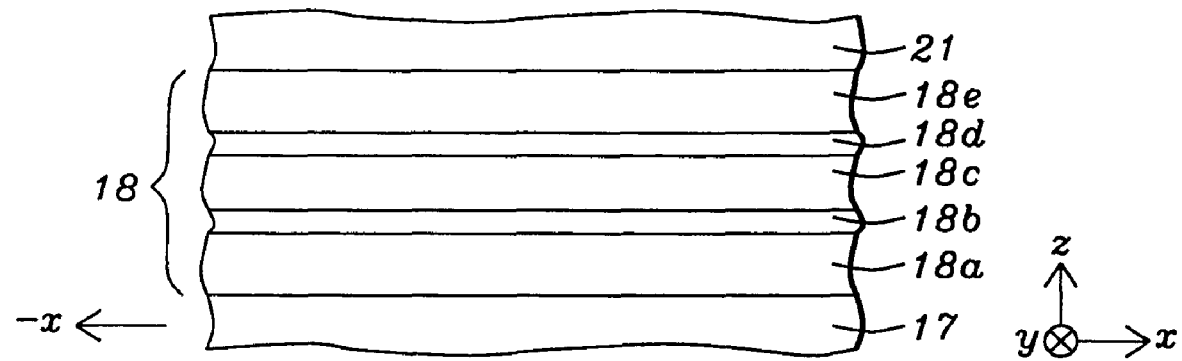
FIG. 3 is a cross-sectional view of the CPP-GMR spin valve structure in FIG. 1 in which the AP1 layer is enlarged to illustrate the laminated layers therein.

The AP1 layer 18 may be a composite with a [CoFe/Cu]$_n$/CoFe configuration wherein n=2 or 3. In the exemplary embodiment shown in FIG. 3 where n=2, the AP1 layer 18 is comprised of a stack wherein the first, third, and fifth layers 18a, 18c, 18e, respectively, are made of CoFe with a Fe content of 50 to 90 atomic % and a thickness between 7 and 15 Angstroms and preferably 12 Angstroms, and the second and fourth layers 18b, 18d, respectively, are made of Cu with a thickness of 0.5 to 4 Angstroms and preferably 2 Angstroms. The use of a laminated AP1 layer to improve CPP-GMR properties was discussed previously. All of the CoFe and Cu layers in the AP1 layer 18 have a magnetic moment in the "−x" direction when the AP1 layer has a magnetic moment along the "−x" axis.

In a preferred embodiment, a non-magnetic spacer 24 is formed on the SyAP pinned layer 20. When the non-magnetic spacer 24 is made of Cu as in a CPP-GMR sensor, an oxygen surfactant layer (not shown) may be formed on the copper layer according to a method described in Headway patent application which is herein incorporated by reference in its entirety. The oxygen surfactant layer is less than about 1 atomic layer in thickness and is used to improve lattice matching between the copper layer and an overlying magnetic layer which in this case is the free layer 27. In other words, the oxygen surfactant layer relieves stress in the spin valve structure 1 and is also used to grow a smooth overlying magnetic layer. Alternatively, for a TMR sensor, the non-magnetic spacer 24 is referred to as a tunnel barrier layer and is comprised of a dielectric material such as AlOx.

In the exemplary embodiment, the non-magnetic spacer 24 is comprised of Cu with a thickness of about 20 to 50 Angstroms and has a confining current path (CCP) layer 22 formed between a lower copper layer 21 and an upper copper layer 23. As mentioned previously, a CCP layer may be employed in a CPP-GMR spin valve structure to improve performance. In one aspect, the lower Cu layer 21 is about 2 to 8 Angstroms thick and preferably 5.2 Angstroms thick, and the upper Cu layer 23 has a thickness between 2 and 6 Angstroms and is preferably 3 Angstroms thick. The CCP layer 22 may be made of AlCu that has been partially oxidized by RF-IAO and RF-PIT processes described in Headway patent application which is herein included by reference in its entirety. The CCP layer 22 has a thickness from 6 to 10 Angstroms and is preferably made from an AlCu layer having a thickness of about 8.5 Angstroms and an Al content of about 90 atomic %.

There is a free layer 27 formed on the non-magnetic spacer 24. The free layer 27 may be a composite having a lower CoFe layer 25 about 5 to 30 Angstroms thick and an upper NiFe layer 26 with a thickness of from 10 to 60 Angstroms. In one aspect, as disclosed in Headway application, the lower CoFe layer 25 has a composition represented by $Fe_vCo_{(100-v)}$ wherein v ranges from about 20 to 70 atomic % and the upper NiFe layer 26 has a composition represented by $Ni_wFe_{(100-w)}$ wherein w ranges from 85 to 100 atomic %. Traditionally, the Fe content in a CoFe free layer has been kept below 20 atomic % because of a concern about unacceptably high magnetostriction ($\lambda_S$) and Hc values associated with a Fe content of $\geq$20 atomic %. Typically, the NiFe component has a Ni content of <85 atomic % in order to maximize the Fe content since it is well known that a higher Fe concentration in a free layer improves the MR ratio of a spin valve. The inventors achieved a higher MR ratio by increasing the Fe content to $\geq$20 atomic % in the lower CoFe layer 25 and by raising the Ni content to $\geq$85 atomic % in the NiFe layer 26 which is magnetically coupled to the lower CoFe layer 25. Thus, the $\lambda_S$ and Hc values for the free layer 27 are maintained within acceptable limits without significantly affecting the MR ratio gain from the CoFe component.

In a preferred embodiment, the CoFe layer 25 has a $Co_{75}Fe_{25}$ composition and a thickness of about 20 Angstroms while the NiFe layer 26 has a $Ni_{90}Fe_{10}$ composition and a thickness of about 28 Angstroms. The aforementioned $Co_{75}Fe_{25}$ and $Ni_{90}Fe_{10}$ layers are advantageously selected since the magnetic moment of $Ni_{90}Fe_{10}$ is very small and its magnetostriction is negative while the magnetic moment of $Co_{75}Fe_{25}$ is only slightly larger than that of $Co_{90}Fe_{10}$ and its magnetostriction is slightly positive. As a result, a composite free layer 27 comprised of $Co_{75}Fe_{25}/Ni_{90}Fe_{10}$ will allow the maximum contribution from the bulk scattering of the $Co_{75}Fe_{25}$ layer while maintaining free layer softness and small magnetostriction. The magnetic moment of the free layer 27 is preferably aligned along the y-axis in a quiescent state and can rotate to a magnetic direction along the x-axis under an appropriately sized applied magnetic field such as when the spin valve structure 1 is moved along the ABS plane over a magnetic disk in the z-direction.

The top layer in the spin valve stack is a cap layer 28 that in one embodiment has a Cu/Ru/Ta/Ru configuration in which the Cu layer has a thickness of 10 to 40 Angstroms, the lower Ru layer has a thickness of 10 to 30 Angstroms, the Ta layer is 40 to 80 Angstroms thick, and the upper Ru layer is 10 to 30 Angstroms thick. Optionally, other cap layer materials used in the art may be employed as the cap layer 28.

Table 1 lists the properties of CPP-GMR spin valve structures B and C according to the present invention compared with a CPP-GMR spin valve structure A previously fabricated by the inventors. The spin valve structures differ only in the composition of the AP2 portion of the pinned layer. The remaining layers in the bottom spin valve structures A-C (including composition and thickness) are the seed layer (Ta50/Ru20); AFM layer (IrMn70); SyAP AP1 layer ($Fe_{50}Co_{50}$12/Cu2)$_2$/$Fe_{50}Co_{50}$12]; SyAP coupling layer (Ru7.5), copper spacer with CCP layer (Cu5.2/AlCu8.5/OX/Cu3); and cap layer (Cu30/Ru10/Ta60/Ru10). The AP2 layer in structure A is made of a 38 Angstrom thick $Fe_{50}Co_{50}$ layer while the AP2 trilayer in structure B is an FCC-like trilayer having a 10 Angstrom thick lower $Co_{90}Fe_{10}$ layer, a 10 Angstrom thick $Fe_{95}Ta_5$ middle layer, and a 34 Angstrom thick upper $Co_{90}Fe_{10}$ layer. Structure C has a FCC-like AP2 trilayer comprised of a 10 Angstrom thick lower $Co_{90}Fe_{10}$ layer, a 15 Angstrom thick $Fe_{70}Co_{30}$ middle layer, and a 26 Angstrom thick upper $Co_{90}Fe_{10}$ layer.

One advantage of the present invention is shown by the results in Table 1 which lists the EM performance of CPP-GMR devices with sensor structures A, B, and C that were stressed with a standard procedure involving 120 mV and 130° C. conditions. Note that the criterion for device fail is a signal drop of over 10% from an original value at t=0. Structure A shows a 10 hour survival rate of only 87% and a 60 hour survival rate of 80% which are not acceptable for read head applications. On the other hand, structures B and C exhibit a 100% survival rate after 10 and 60 hours which is a significant improvement. Thus, by replacing a conventional CoFe AP2 layer with a FCC-like trilayer of the present invention, the EM performance of a CPP-GMR read head is remarkably improved.

TABLE 1

EM Performance for CPP-GMR sensors with various AP2 layer configurations

| Structure | AP2 Layer Composition | 10 hr. survival rate (%) | 60 hr. survival rate (%) |
| --- | --- | --- | --- |
| A | $Fe_{50}Co_{50}38$ | 87 | 80 |
| B | $Co_{90}Fe_{10}10/Fe_{95}Ta_510/Co_{90}Fe_{10}34$ | 100 | 100 |
| C | $Co_{90}Fe_{10}10/Fe_{70}Co_{30}15/Co_{90}Fe_{10}26$ | 100 | 100 |

Another advantage of the present invention is indicated by the results in Table 2 which show that the MR ratios of the CPP-GMR sensors having structures B and C are enhanced compared with the MR ratio of structure A that has a conventional AP2 layer. Moreover, the RA (resistance×area) values of structures B and C are maintained at acceptable levels. Therefore, the enhanced MR ratio of structures B and C leads to a higher output signal for the CPP-GMR sensor 1 and read head without compromising other properties.

TABLE 2

Results for CPP-GMR sensors with various AP2 layer configurations

| Structure | AP2 Layer Composition | MR Ratio | RA (ohm-μm²) |
| --- | --- | --- | --- |
| A | $Fe_{50}Co_{50}38$ | 8.6% | 0.5 |
| B | $Co_{90}Fe_{10}10/Fe_{95}Ta_510/Co_{90}Fe_{10}34$ | 9% | 0.47 |
| C | $Co_{90}Fe_{10}10/Fe_{70}Co_{30}15/Co_{90}Fe_{10}26$ | 10% | 0.21 |

Figure 2:
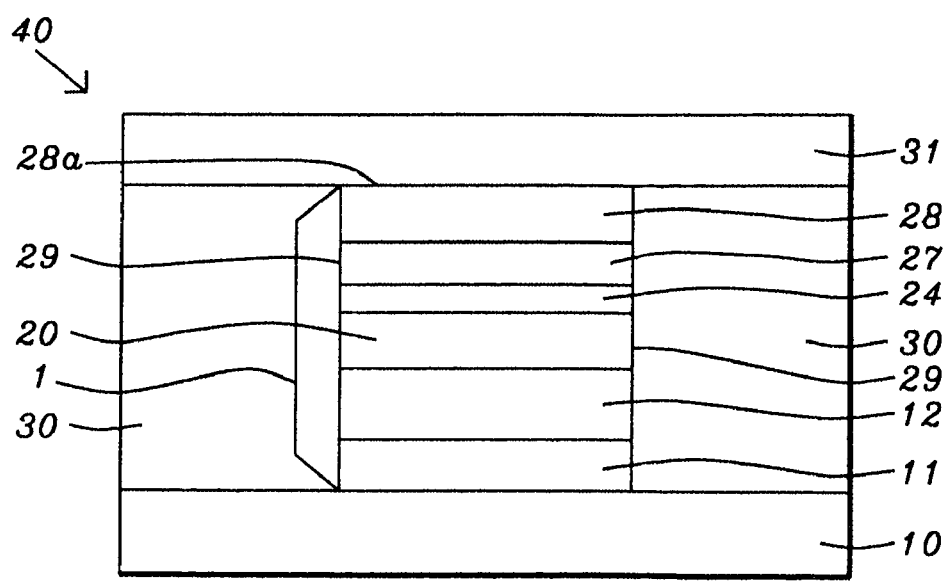
FIG. 2 is a cross-sectional view of a CPP-GMR read head showing the spin valve structure of the present invention formed between a first shield and a second shield.

Referring to FIG. 2, a method of fabricating a magnetic read head 40 that includes the spin valve structure 1 from FIG. 1 will now be described. A substrate 10 is provided as mentioned previously and may be a first magnetic shield (S1) formed by a conventional method in the read head 40. The spin valve stack described previously is laid down by a process in which the seed layer 11, AFM layer 12, pinned layer 20, non-magnetic spacer 24, free layer 27, and cap layer 28 are sequentially formed on the substrate 10. A DC magnetron sputter system such as one available from Anelva may be employed that is capable of a base pressure of at least $1 \times 10^{-8}$ torr and preferably less than $5 \times 10^{-9}$ torr. A low base pressure allows films to be sputter deposited with higher uniformity and reproducibility. It should be understood that a sputter chamber may have multiple targets which are low pressure discharge cathodes. The sputter gas is preferably Ar. All of the sputter deposited films may be laid down in the same sputter chamber or in different sputter chambers within the same mainframe. For example, the seed layer 11, AFM layer 12, pinned layer 20, and lower Cu layer (not shown) in the non-magnetic spacer 24 may all be deposited in the same sputter chamber.

In an embodiment where the non-magnetic spacer 24 is comprised of a lower Cu layer 21, a CCP layer 22, and an upper Cu layer 23 (FIG. 1), the CCP layer may be formed by depositing an AlCu layer about 6 to 10 Angstroms thick on the lower Cu layer followed in succession by a RF (plasma or ion treatment) PIT process and a RF-IAO process to form a partially oxidized AlCu layer. The RF PIT and RF-IAO (plasma oxidation or ion assisted oxidation) processes are preferably performed in a separate chamber within the sputter system. The RF PIT process preferably involves a low power plasma etch to remove about 1 to 3 Angstroms of the AlCu layer and may comprise the following conditions: an Ar flow rate of about 50 sccm and a RF power level of 17 to 20 Watts for about 20 to 60 seconds. During the RF-IAO process, the AlCu layer is subjected to plasma oxidation which converts the AlCu layer into CCP layer 22 that is essentially a porous aluminum oxide layer whose pores are filled with Cu. The RF-IAO process typically comprises the following conditions: an Ar flow rate of about 30-50 sccm and preferably 35 sccm, an $O_2$ flow rate of 0.3 to 1 sccm and preferably 0.5 sccm, and a RF power level of 20 to 30 W for about 15 to 45 seconds. Subsequently, the upper Cu layer 23 is sputter deposited on the CCP layer 22 followed by the sequential deposition of the free layer 27 and cap layer 28 on the upper Cu layer.

After all of the layers in the spin valve stack are laid down on the substrate 10, an annealing step may be performed by applying a 10000 Oersted magnetic field along a certain axis for 5 hours at about 280° C. Thereafter, the spin valve stack is patterned and etched by a well known process that employs a photoresist layer (not shown) and an ion beam etch (IBE) method, for example. Following the etch step, a spin valve structure having a top surface 28a and sidewalls 29 is defined. An insulating layer 30 is typically deposited to a depth that covers the sidewalls 29. There may also be a biasing layer (not shown) that is formed within the insulating layer 30 proximate to each side of the spin valve structure to provide longitudinal biasing to the free layer as appreciated by those skilled in the art. The photoresist layer is then removed by a lift-off process and the insulating layer 30 may be smoothed by a planarization technique such as a chemical mechanical polish (CMP) method to become coplanar with the top surface 28a.

The remainder of the read head 40 may then be fabricated by a conventional process. For example, a second magnetic shield 31 may be formed on the top surface 28a and over the insulating layer 30. Those skilled in the art will appreciate that in a CPP spin valve structure, the second magnetic shield (S2) 31 is also used as the top conductor lead layer. The first magnetic shield (S1) 10 serves as the bottom conductor lead layer.

While this invention has been particularly shown and described with reference to, the preferred embodiment thereof, it will be understood by those skilled in the art that various changes in form and details may be made without departing from the spirit and scope of this invention.

We claim:

1. A method of forming a spin valve structure in a magnetic read head comprising:

(a) providing a substrate; and (b) sequentially forming a seed layer, AFM layer, pinned layer having an AP2/coupling/AP1 configuration, non-magnetic spacer, free layer, and cap layer on the substrate wherein the AP2 portion of the pinned layer is an FCC-like trilayer with an upper ferromagnetic layer having a first thickness and lower ferromagnetic layer having a second thickness less than the first thickness and made of CoFe and a middle ferromagnetic layer comprised of an Fe alloy, said middle ferromagnetic layer contacts an upper surface of said lower CoFe layer and said upper ferromagnetic layer contacts an upper surface of said middle ferromagnetic layer.

2. The method of claim 1 wherein the AP2 layer has a composition represented by $Co_zFe_{(100-Z)}/Fe_{(100-X)}Ta_X/Co_zFe_{(100-Z)}$ in which x is about 3 to 30 atomic % and z is about 75 to 100 atomic %.

3. The method of claim 2 wherein z is about 90 atomic %, x is about 5 atomic %, the thickness of the lower $Co_zFe_{(100-Z)}$ layer is from about 6 to 15 Angstroms, the thickness of the $Fe_{(100-X)}Ta_X$ layer is between about 5 and 15 Angstroms, and the thickness of the upper $Co_zFe_{(100-Z)}$ layer is from about 10 to 50 Angstroms.

4. The method of claim 1 wherein the AP2 layer has a composition represented by $Co_zFe_{(100-Z)}/Fe_yCo_{(100-Y)}/Co_zFe_{(100-Z)}$ in which y is about 40 to 100 atomic % and z is about 75 to 100 atomic %.

5. The method of claim 4 wherein z is about 90 atomic %, y is about 70 atomic %, the thickness of the lower $Co_zFe_{(100-Z)}$ layer is from about 6 to 15 Angstroms, the thickness of the $Fe_yCo_{(100-Y)}$ layer is between about 5 and 15 Angstroms, and the thickness of the upper $Co_zFe_{(100-Z)}$ layer is from about 10 to 50 Angstroms.

6. The method of claim 1 wherein said middle layer comprised of an Fe rich alloy is FeCr, FeV, FeW, FeZr, FeNb, FeHf, or FeMo wherein the Fe content is greater than about 70 atomic %.

7. The method of claim 1 wherein the non-magnetic spacer is comprised of a lower copper layer, a middle confining current path (CCP) layer, and an upper copper layer, said CCP layer is formed by depositing an AlCu layer about 6 to 10 Angstroms thick on the lower Cu layer followed in succession by a RF (plasma or ion treatment) PIT process and a RF-(ion assisted oxidation) IAO process to form a partially oxidized AlCu layer.

8. The method of claim 1 wherein all of the layers in said spin valve structure are formed in a sputter deposition system.

9. The method of claim 1 further comprised of annealing the spin valve structure after all of the layers in step (b) are formed.

* * * * *